(12) United States Patent
McGeoch

(10) Patent No.: US 11,901,903 B2
(45) Date of Patent: Feb. 13, 2024

(54) ELECTRICAL PULSE COMPRESSION CIRCUIT

(71) Applicant: PLEX Corporation, Fall River, MA (US)

(72) Inventor: Malcolm W. McGeoch, Little Compton, RI (US)

(73) Assignee: PLEX Corporation, Fall River, MA (US)

( * ) Notice: Subject to any disclaimer, the term of this patent is extended or adjusted under 35 U.S.C. 154(b) by 0 days.

(21) Appl. No.: 18/070,537

(22) Filed: Nov. 29, 2022

(65) Prior Publication Data

US 2023/0170886 A1    Jun. 1, 2023

Related U.S. Application Data

(60) Provisional application No. 63/284,036, filed on Nov. 30, 2021.

(51) Int. Cl.
*H03K 3/45* (2006.01)
*H03K 17/80* (2006.01)
*H03K 17/56* (2006.01)
*H01S 3/097* (2006.01)
*H03H 11/02* (2006.01)
*H01S 3/225* (2006.01)

(52) U.S. Cl.
CPC ........... *H03K 3/45* (2013.01); *H01S 3/09702* (2013.01); *H03H 11/02* (2013.01); *H03K 17/56* (2013.01); *H03K 17/80* (2013.01); *H01S 3/2256* (2013.01)

(58) Field of Classification Search
CPC .......... H03K 3/45; H03K 17/56; H03K 17/80; H03H 11/02
See application file for complete search history.

(56) References Cited

U.S. PATENT DOCUMENTS

| 2,461,321 | A | 2/1949 | Guillemin |
| 2,869,004 | A | 1/1959 | Melville |
| 4,275,317 | A | 6/1981 | Frosch et al. |
| 10,109,447 | B1 * | 10/2018 | Hoff ........................ H01J 23/04 |

OTHER PUBLICATIONS

Obenschaine et al., Pathway to a lower cost high repetition rate ignition facility. Phys.Plasmas. May 26, 2006;13:056320-056320-11.

* cited by examiner

*Primary Examiner* — Daniel C Puentes
(74) *Attorney, Agent, or Firm* — Wolf, Greenfield & Sacks, P.C.

(57) ABSTRACT

A rectangular electrical pulse enters a transmission line structure with single pass transit time equal to ½ the duration of the pulse, open circuit at the extreme end and a switch at its center. After a delay equal to ¾ of the rectangular pulse duration the central switch is closed to couple the contents of the transmission line structure into another transmission line of half impedance. The output pulse maintains the initial voltage, but is of half the initial duration, and double the initial power.

7 Claims, 4 Drawing Sheets

ELECTRICAL PULSE COMPRESSION CIRCUIT

CROSS REFERENCE TO RELATED APPLICATION

This application claims priority based on Provisional Application Ser. No. 63/284,036, filed Nov. 30, 2021, which is hereby incorporated by reference in its entirety.

TECHNICAL FIELD

This invention relates to the generation of high voltage electrical pulses with a well-defined rectangular shape for use in diverse applications including but not limited to excitation of gas lasers, acceleration of charged particles and generation of electron beams for chemical processing.

BACKGROUND

High voltage electron beams, high power microwave generators and pulsed particle accelerators usually require the delivery of energy in a "flat-topped" or "rectangular" pulse at a desired voltage V with as little lost energy as possible due to "rise time" and "fall time" when lack of the correct voltage causes the device to work imperfectly, and can even be a cause of excessive energy loss at certain points in the device. For example, the electron beam required to excite a krypton fluoride (KrF) laser for energy production [1] via laser-induced fusion must spend as little time as possible at fractional voltage because partial voltages give non-uniform deposition in the laser gas, and cause excessive heating in the foil window between the electron gun and the laser gas.

For long device life it is necessary to use solid state switching within the "pulsed power modulator" that generates the rectangular voltage pulse. Solid state switches include active semiconductor devices such as thyristors, IGBTs and the like, often in combination with passive magnetic switches [2,3] in which saturation of a magnetic core gives a sudden drop in circuit inductance and impedance. Magnetic switches, however, have limited magnetic flux swing owing to fundamental material limitations, so their volume is often very considerable. The disadvantages of a large switch volume are twofold: firstly the magnetic switch is costly, and secondly, the relatively large saturated inductance and stray capacity of the switch can degrade the rise and fall of a rectangular pulse that the switch is generating.

SUMMARY

The present technology reduces the volume requirement of a magnetic switch by several times relative to prior methods of pulse generation. Following from this volume reduction there is an improvement in pulse shape relative to prior art methods. In accordance with embodiments, a compressor circuit comprises two transmission lines AB and BC each of round trip transit time $\tau/2$ and impedance Z connected to each other at point B with end C open circuit, and a switch S connecting point B to an output transmission line or load of impedance Z/2, wherein: with switch S open, a rectangular pulse of voltage V and duration $\tau$ enters the compressor at point A and propagates within the compressor for a time $3\tau/4$ after which switch S closes to connect point B to the output transmission line or load, generating a pulse of voltage V and duration $\tau/2$ therein.

DETAILED DESCRIPTION

Figure 1:
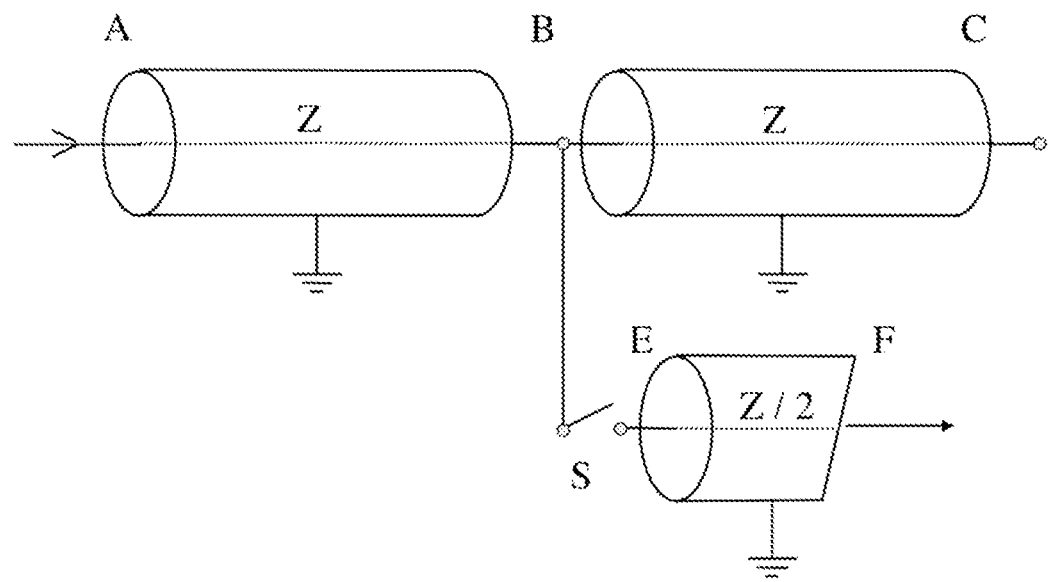
FIG. 1 depicts a circuit according to the invention.

The present technology is illustrated in FIG. 1. A pulse compressor structure comprises two transmission lines, labelled AB and BC, each of impedance Z and round-trip time $\tau/2$. The second of these lines is open circuit at its outer end C. At the junction B of the two lines there is a saturable magnetic output switch S that couples the pulse, when it conducts, into parallel-connected half-impedance (Z/2) line EF for transport to the device load, or further compression. In operation a "slow" pulse of duration $\tau$ is fed into the structure at end A from a rectangular pulse generator. This pulse propagates through both lines to end C (switch S is open at this stage) and reflects with voltage doubling back toward position B. The magnetic switch is designed to saturate (and conduct) at the precise time the leading edge of the "slow" pulse reflected from open end C has reached junction point B for the second time. Following switch closure, the pulse stored in line BC is superimposed upon the second half of the slow pulse entering from end A. The two components add in line EF, still at the original voltage V generating an output pulse of length $\tau/2$. The structure halves the incoming pulse duration and doubles the current, leaving the voltage unchanged. The magnetic switch only has to hold off voltage V for a time $\tau/2$. The cross sectional area of this switch is proportional to $V\tau/2$, so a relatively small area is possible. In a typical prior art design [3], the magnetic switch is deployed at the output end of a pulse-forming network or line charged to voltage 2V, with charging time at least two times longer than the discharge time $\tau/2$, and correspondingly, a magnetic core area two or three times greater than that of the present technology.

In order to follow the operation in more detail, the propagation of a pulse through the compressor is shown stage by stage in FIGS. 2a through 2e, in which the voltage is plotted against position in the structure.

Figure 2A:
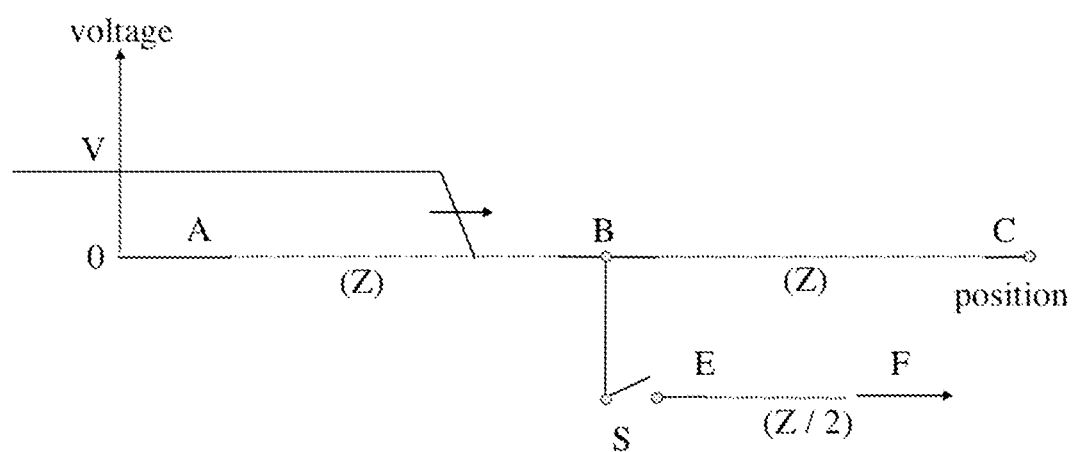
FIG. 2a shows a transmission line circuit in its initial state with switch open and an entering rectangular electrical pulse.

In FIG. 2a the leading edge of a rectangular pulse of voltage V that has been fed into the compressor structure is propagating toward point B. The whole duration of this pulse is not illustrated as it physically would stretch twice the length of line ABC. The initial rectangular pulse has duration T and each of lines AB, BC has single pass duration $\tau/4$, i.e. each of them has round trip duration $\tau/2$.

Figure 2B:
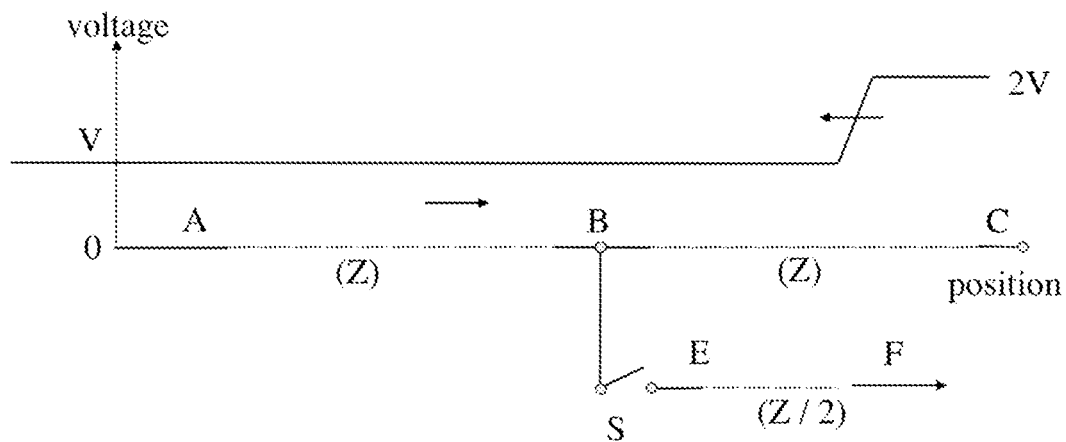
FIG. 2b shows the state of the circuit immediately following reflection of the leading edge of the pulse at the open circuit end C.

In FIG. 2b the pulse has passed into section BC and reflected at the open circuit end C. The voltage reflection coefficient of a transmission line of impedance Z terminated by an impedance $Z_T$ is $(Z_T-Z)/(Z_T+Z)$, giving a reflection coefficient of +1 at end C, so the incident and reflected waves add to voltage 2V.

Figure 2C:
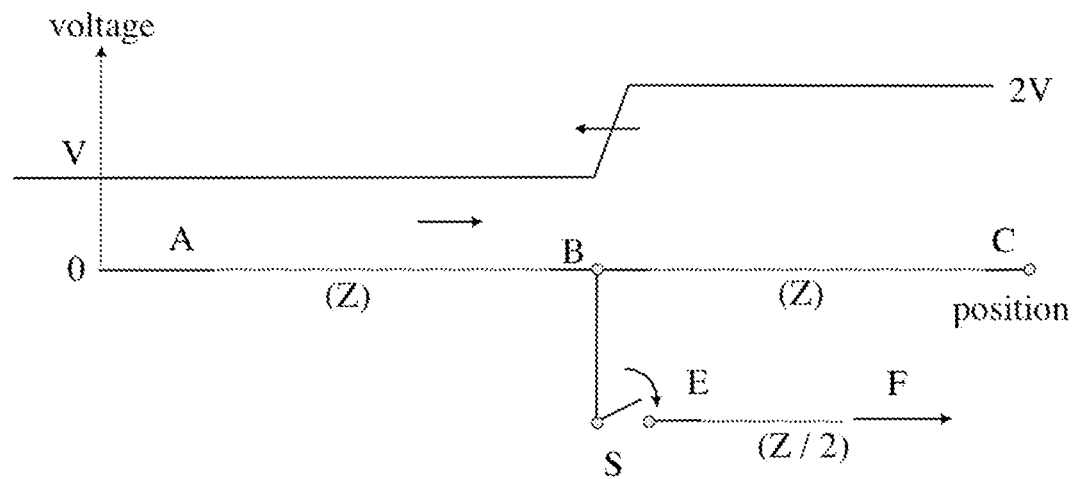
FIG. 2c shows the state of the circuit exactly when the leading edge of the reflected pulse reaches point B and switch S closes.

In FIG. 2c the reflected leading edge has just reached position B where the output switch S is located. At precisely this time, switch S is closed (it may be a saturable magnetic core) and a new condition is imposed at point B. With switch S closed a wave incident at B from either direction A or C will be reflected from an effective impedance comprised of Z in parallel with Z/2 (due to the output line), i.e. an effective termination impedance $Z_T=Z/3$. The voltage reflection coefficient at B therefore becomes $(Z/3-Z)/(Z/3+Z)=-\frac{1}{2}$. The voltage transmission coefficient is $2Z_T/(Z_T+Z)=\frac{1}{2}$.

Figure 2D:
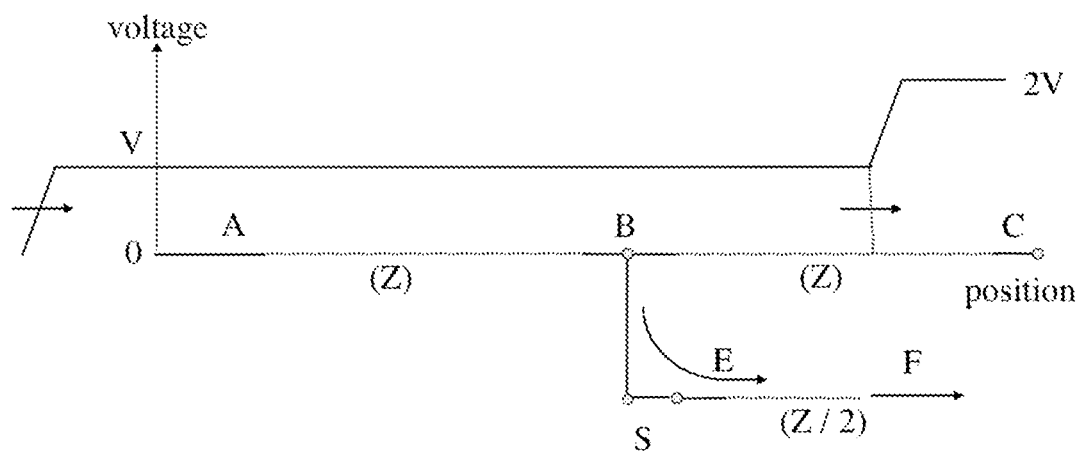
FIG. 2d shows the propagation of a negative-going pulse edge in line section BC as the section unloads through switch S.

In FIG. 2d, after switch S has closed, the wave propagating backward from B to A has zero amplitude because it comprises the sum of a reflected wave $-V/2$ and a transmitted wave $V/2$. The forward wave propagating toward C from B drops to amplitude zero for the same reason.

Figure 2E:
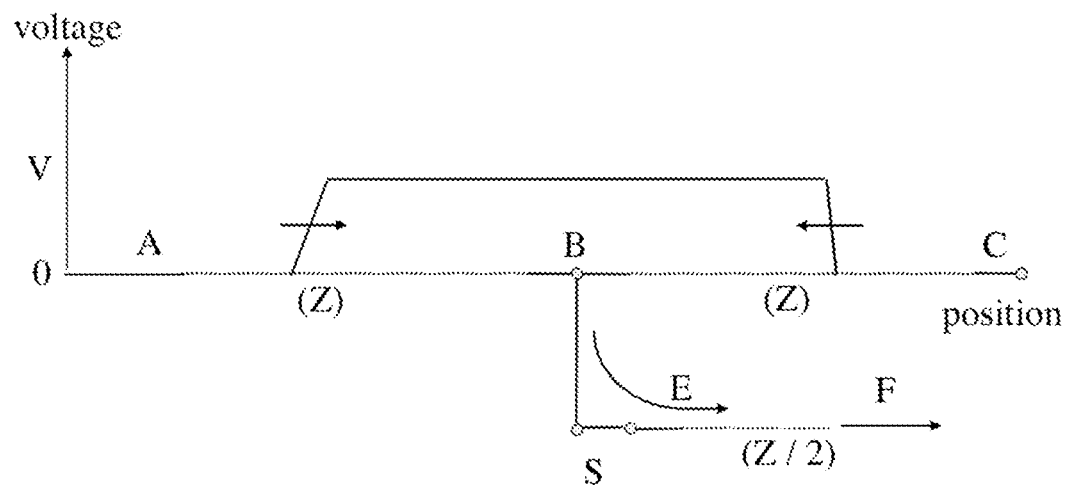
FIG. 2e shows the final phase of circuit operation in which the remaining parts of the incoming and reflected pulse converge on the switch.

FIG. 2e shows the final stage of the compressor action in which the remaining parts of the two waves propagate toward point B. Consideration of the propagation times shows that the pulse generated in line EF has duration $\tau/2$, exactly half that of the input pulse. The output pulse in line EF is at voltage V because two waves with transmission V/2 add together. As the impedance of this line is half that of lines AB or BC, the power in the pulse is doubled at the same time as the duration is halved.

In practice the entering "rectangular" pulse at point A has non-zero rise and fall times, as shown in FIG. 2, and these are modified in the output pulse on line EF. If the switch S has relatively compact size and low inductance or stray capacity, and if its magnetic material is chosen for appropriate low loss in the operating conditions, the rise and fall times of the compressed pulse can be shorter than those of the entering rectangular pulse.

The transmission lines in the above method of pulse compression can be substituted by lumped element delay lines of the appropriate impedance and transit time.

Series Compressors

Figure 3:
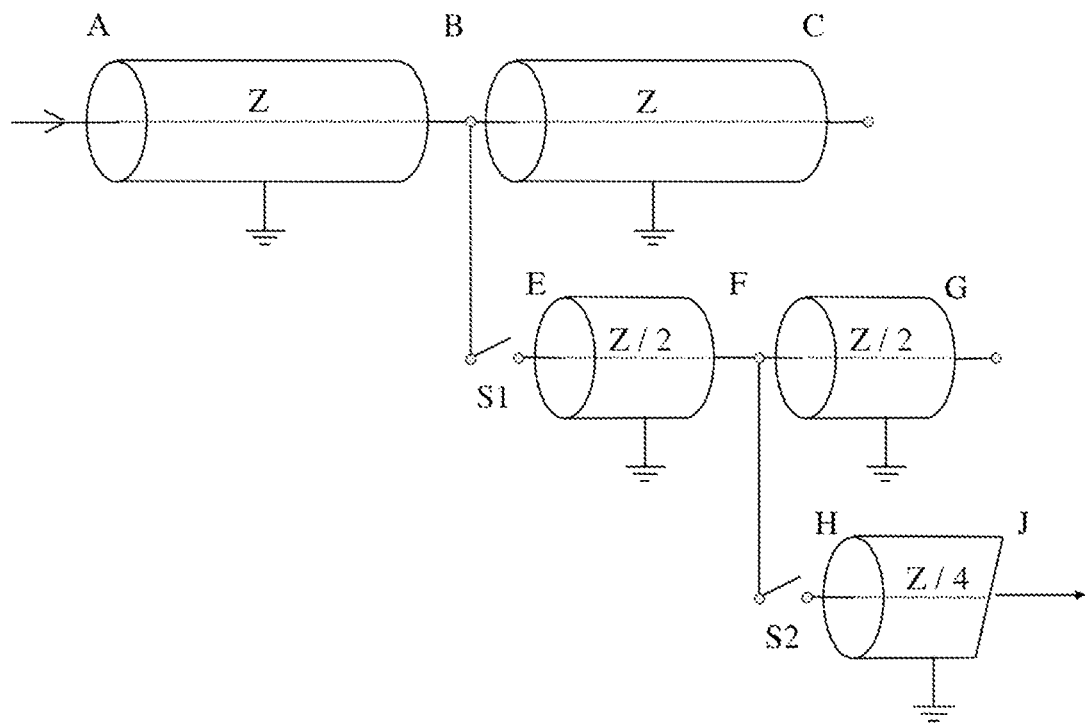
FIG. 3 shows two pulse compressor circuits in sequence generating a pulse one quarter of the initial duration in a line of quarter impedance.

It is possible to have N compressors in series to achieve $2^N$ pulse compression. This concept is illustrated in FIG. 3 for the case of N=2. Note that the second compressor uses lines of half the length of those in the first compressor. In operation, a rectangular pulse of duration $\tau$ and voltage V enters the first compressor at point A. After time $3\tau/4$ when switch S1 has closed, a rectangular pulse of duration $\tau/2$ and voltage V begins to enter the second compressor at point E. After a further time delay of $3\tau/8$ switch S2 is closed, and a rectangular pulse of duration $\tau/4$ begins to enter line HJ or an equivalent load of impedance Z/4.

Generators of Rectangular Pulses

A wide variety of rectangular pulse generators is available. The networks of Guillemin [4] provide many possibilities. When such networks are composed of lumped circuit elements the number of "harmonics" added into the rectangular pulse determines its rise and fall time. All of these circuits, however, place great stress on the rate of current rise in the switch that triggers release of stored energy from the circuit. In all cases, the switch is effectively in series with the load, and the rate of current rise needed within the load translates directly to the switch requirement. Solid state switches of the semiconductor type have rather small conduction zones, and there are limits to the rate of carrier spread which translate into limits on the rate of current rise (dI/dt) in the switch. It is therefore desirable to "unload" the Guillemin network via saturation of a magnetic switch that can support higher dI/dt values than a semiconductor switch. The network can be charged on a timescale several times longer than the generated rectangular pulse via semiconductor switching, and in this case, the switch dI/dt requirement is greatly relaxed. Also, the peak switch current can be many times less than the generated current if the switches are "off line", as illustrated in the pulse generator of FIG. 4.

Figure 4:
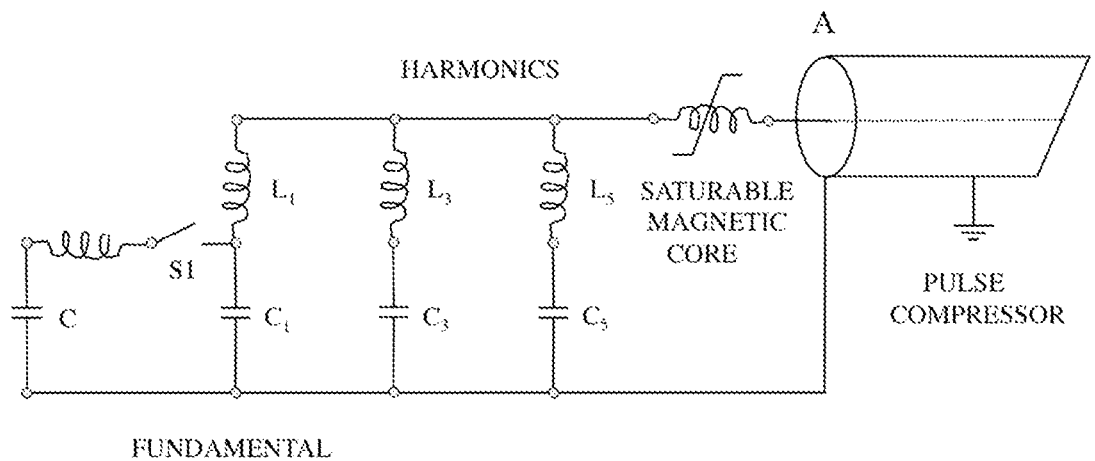
FIG. 4 shows one of many possible schemes for the generation of a rectangular pulse prior to entry into the pulse compressor circuit.

With reference to FIG. 4, capacitor C is initially charged to a steady voltage via a DC voltage source (not shown in the figure). Semiconductor switch S1 is closed and the energy stored in C is transferred on a relatively slow timescale into the several capacitors of a Guillemin pulse generator. C1 is the fundamental capacitor and C3, C5 are two of the harmonics. Typically at least the 7th harmonic (not shown in FIG. 4) is also included for fairly rapid rise and fall times in the generated rectangular pulse. L1, L3 and L5 are the associated inductances. A saturable magnetic core serves as the output switch of the pulse forming network. It is designed to saturate just as the energy transfer out of C is complete, and rapidly unload the energy stored in the network into a pulse compressor with the same impedance as the network. The entry point of the compressor, labelled A, is shown in the figure. This design places the semiconductor switch outside of the high current path, that is to say "off line", where it does not have to carry such a high peak current or such a rapidly rising current as the magnetic output switch.

REFERENCES

1. S. P. Obenschain, D. G. Colombant, A. J. Schmitt, J. D. Sethian and M. W. McGeoch, "Pathway to a Lower Cost High Repetition Rate Ignition Facility", Physics of Plasmas 13, 56320-1-11 (2006).
2. W. S. Melville, "Pulse Generating Electrical Circuit Arrangements" U.S. Pat. No. 2,869,004 (1959).
3. R. A. Frosch, J. B. Laudenslager and T. J. Pacala, "Pulse Switching for High Energy Lasers", U.S. Pat. No. 4,275, 317 (1981).
4. E. A. Guillemin, "Production of Electric Pulses" U.S. Pat. No. 2,461,321 (1949).

The invention claimed is:

1. A compressor circuit comprising two transmission lines AB and BC each of round trip transit time $\tau/2$ and impedance Z connected to each other at point B with end C open circuit, and a switch S connecting point B to an output transmission line or load of impedance Z/2, wherein: with switch S open, a rectangular pulse of voltage V and duration $\tau$ enters the compressor at point A and propagates within the compressor for a time $3\tau/4$ after which switch S closes to connect point B to the output transmission line or load, generating a pulse of voltage V and duration $\tau/2$ therein.

2. A compressor circuit as in claim 1, in which the output switch S is a saturable magnetic core.

3. A compressor circuit as in claim 1, in which transmission lines AB and BC are lumped element circuits of equivalent impedance Z and round trip propagation time $\tau/2$.

4. A series of two or more compressor circuits each as in claim 1, with the input terminal A of each succeeding compressor connected to the output switch S of the prior compressor, and having transmission lines of half duration and half impedance relative to those in the prior compressor.

5. A compressor circuit as in claim 1, driven by the output of a pulse charged Guillemin network.

6. A series of compressor circuits as in claim 4, driven by the output of a pulse charged Guillemin network.

7. A compressor circuit as in claim 5, in which the driving rectangular pulse generator network is pulse charged by the conduction of solid state semiconductor switches that are off-line within the fundamental frequency section of the network, the harmonics of the network being charged passively from the fundamental section.

* * * * *